United States Patent
Wurm et al.

(10) Patent No.: US 7,547,505 B2
(45) Date of Patent: Jun. 16, 2009

(54) METHODS OF FORMING CAPPING LAYERS ON REFLECTIVE MATERIALS

(75) Inventors: Stefan Wurm, Austin, TX (US); Nora V. Edwards, Austin, TX (US)

(73) Assignees: Infineon Technologies AG, Munich (DE); Freescale Semiconductor, Inc., Austin, TX (US)

( * ) Notice: Subject to any disclaimer, the term of this patent is extended or adjusted under 35 U.S.C. 154(b) by 926 days.

(21) Appl. No.: 11/038,838

(22) Filed: Jan. 20, 2005

(65) Prior Publication Data

US 2006/0160034 A1 Jul. 20, 2006

(51) Int. Cl.
*G03F 7/00* (2006.01)
*G02B 5/12* (2006.01)

(52) U.S. Cl. .................. 430/330; 427/166; 427/294; 359/848

(58) Field of Classification Search ............. 430/330; 359/584, 883, 848; 428/212, 218, 615; 427/166, 427/294
See application file for complete search history.

(56) References Cited

U.S. PATENT DOCUMENTS 6,160,867 A * 12/2000 Murakami ............... 378/84
6,228,512 B1 * 5/2001 Bajt et al. ............... 428/635
2003/0008180 A1 * 1/2003 Bajt et al. ............... 428/698
2004/0130693 A1 * 7/2004 Kurt ....................... 355/67

OTHER PUBLICATIONS

Wolf, S., et al., "Silicon Processing for the VLSI Era: vol. 1—Process Technology," 2nd Ed., 2000, pp. 109-112, Lattice Press, Sunset Beach, CA.
Wolf, S., et al., "Silicon Processing for the VLSI Era: vol. 1—Process Technology," 2nd Ed., 2000, pp. 546-548, Lattice Press, Sunset Beach, CA.
Wolf, S., et al., "Silicon Processing for the VLSI Era: vol. 1—Process Technology," 2nd Ed., 2000, pp. 638-650, Lattice Press, Sunset Beach, CA.

* cited by examiner

*Primary Examiner*—Thorl Chea
(74) *Attorney, Agent, or Firm*—Slater & Matsil, L.L.P.

(57) ABSTRACT

A reflective material is heated to reduce internal stress, and then a capping layer is formed over the reflective material. Heating the reflective material reduces the internal stress of the reflective material. Because the reflective material has reduced internal stress, a more continuous, stable and reliable capping layer is formed that is not subject to stress induced degradation over time due to the relaxing internal stress of the underlying reflective material. Thus, the capping layer remains intact and protects the reflective material residing beneath the capping layer from exposure to contaminants.

25 Claims, 3 Drawing Sheets

METHODS OF FORMING CAPPING LAYERS ON REFLECTIVE MATERIALS

TECHNICAL FIELD

The present invention relates generally to semiconductor devices, and more particularly to capping layers for extreme ultraviolet lithography (EUVL) mirrors.

BACKGROUND

Semiconductor devices are manufactured by depositing many different types of material layers over a semiconductor workpiece or wafer, and patterning the various material layers using lithography. The material layers typically comprise thin films of conductive, semiconductive, and insulating materials that are patterned and etched to form integrated circuits (IC's).

For many years in the semiconductor industry, optical lithography techniques such as contact printing, proximity printing, and projection printing have been used to pattern material layers of integrated circuits. Projection printing is commonly used in the semiconductor industry, using wavelengths of 248 nm or 193 nm, as examples. At such wavelengths, lens projection systems and transmission lithography masks are used for patterning, wherein light is passed through lithography masks to impinge upon a wafer.

However, as the minimum feature sizes of IC's are decreased, the semiconductor industry is trending towards the use of very short wavelength, immersion lithography technologies or non-optical lithographic techniques to achieve the decreased feature sizes demanded by the industry.

For lithographic printing of integrated circuit patterns below about 50 nm feature sizes, extreme ultraviolet lithography (EUVL) technology using light in the soft x-ray range (e.g., about 10 to 15 nm) is under development. Ultraviolet (UV) light has a shorter wavelength than visible light. For example, UV light is usually considered to fall within the wavelength range of about 157 to 400 nm. In EUVL, extreme UV (EUV) light, having a shorter wavelength than UV light, e.g., about 13.5 nm, is used as the wavelength. In EUVL, plasma is used to generate a broadband radiation with significant EUV radiation. The plasma is either generated by laser radiation bombarding a target material such as Xe or Sn or by an electrical discharge, as examples. The EUV radiation is collected by a system of mirrors coated with EUV reflecting interference films, also known as Bragg reflectors. The EUV radiation is then used to illuminate an EUV reflection lithography mask. The pattern on the lithography mask is imaged and de-magnified onto a resist-coated wafer. The entire lithography mask pattern is exposed onto the wafer by synchronously scanning the lithography mask and the wafer.

EUVL is a reflective lithographic technology using mirror elements coated with EUV Bragg reflectors, also referred to in the art as EUV multi-layers. EUV radiation is strongly absorbed in most materials, even gases; therefore, EUV imaging must take place in a very well controlled vacuum environment that reduces rest gas absorption of EUV radiation and protects the multi-layer mirror element surfaces from contaminants. In some types of high vacuum systems, the system can be subjected to a high temperature "bake" or heating process, to lower the partial pressure of water vapor in the system. However, EUVL systems cannot be baked or subjected to extremely high temperatures, because the optics alignment and quality of the multi-layer mirror elements in the EUVL system would be damaged, due to possible intermixing of the Mo/Si superlattice that the EUV optics are comprised of. Thus, the residual water vapor partial pressure that is present (because the system cannot be baked) in EUVL systems causes significant oxidation of the surfaces of the multi-layer mirror elements, if no preventive measures are taken. Oxidation of the multi-layer mirror elements reduces the lifetime of the multi-layer mirror elements and also results in reduced reflectivity, degrading the performance of the EUVL system.

One of the preventive measures to avoid oxidation of the multi-layer mirror element surfaces in EUVL systems that is being explored is the development of protective capping layers. The protective capping layers are deposited on top of the multi-layer mirror element surfaces to protect them from oxidation. However, the capping methods and layers under development have been found to be inadequate in preventing oxidation of the multi-layer mirror element surface. Prior art capping layers temporarily, e.g., for about 230 hours, prevent oxidation, which is insufficient oxidation prevention for production tools that need to remain oxide free for about 30,000 hours, for example. Oxidation of the multi-layer mirror elements results in reduced reflectivity of the multi-layer mirror element, and causes early life failures of the multi-layer mirror element.

What are needed in the art are methods of increasing optics lifetime in EUV lithography systems.

SUMMARY OF THE INVENTION

These and other problems are generally solved or circumvented, and technical advantages are generally achieved, by preferred embodiments of the present invention, which provide novel methods of forming capping layers on multi-layer mirror elements of EUVL systems. The multi-layer material stacks are heated or tempered before the capping layers are formed, reducing the internal material stress of the multi-layer material stacks, and thus preventing cracks from forming in the capping layers, because the stress relaxation has occurred before forming the capping layers. Thus, no oxidation occurs at the top surface of the multi-layer material stack, because the capping layers remain intact.

In accordance with a preferred embodiment of the present invention, a method of forming a capping layer over a reflective material includes providing the reflective material, heating the reflective material, and forming the capping layer over the reflective material. At least a top portion of the reflective material has internal stress, and heating the reflective material reduces the internal stress of at least the top portion of the reflective material.

In accordance with another preferred embodiment of the present invention, a method of manufacturing a multi-layer mirror element includes providing a substrate, and forming a plurality of material layers over the substrate, the plurality of material layers comprising a first internal stress. The method includes heating at least the plurality of material layers to reduce the first internal stress, and forming a capping layer over the plurality of material layers.

In accordance with another preferred embodiment of the present invention, a method of manufacturing a multi-layer mirror element of an EUVL system includes providing a substrate, placing the substrate in a deposition chamber, forming a plurality of material layers over the substrate, the plurality of material layers comprising a first internal stress, heating at least the plurality of material layers, reducing the first internal stress, and forming a capping layer over the plurality of material layers. Forming the plurality of material layers, heating the plurality of material layers, and forming the capping layer are performed in the deposition chamber without removing the substrate from the deposition chamber.

Advantages of embodiments of the present invention include preventing oxidation of multi-layer mirror elements by reducing or eliminating the internal stress of the multi-layer material stacks, so that the capping layers are formed on a stress-free surface. A more stable and reliable capping layer is formed over the stress-free underlying surface. A continuous capping layer may be formed as a result of annealing the multi-layer material stack before forming the capping layer. Because the multi-layer material stacks are protected from oxidation, the multi-layer mirror elements have a longer life, thus resulting in increased EUV optics lifetime and a cost savings. Furthermore, the reflectivity of the multi-layer mirror element remains substantially the same, because the multi-layer mirror element does not oxidize. In addition, carbon deposits can be cleaned from the top surface of the capping layers, without damaging the underlying multi-layer material stacks. The novel method of forming capping layers is a step towards enabling the viability of EUV lithography in high volume production environments, by increasing the lifetime of components of EUV lithography equipment.

The foregoing has outlined rather broadly the features and technical advantages of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to preferred embodiments in a pecific context, namely, multi-layer mirror elements for use in EUVL systems. The invention may also be applied, however, to other applications that involve forming capping layers on multi-layer mirror elements, other reflective materials, or other types of devices that utilize Bragg reflectors, for example. The invention may also be implemented on other components within an EUVL system, such as on EUV lithography mask, for example.

Figure 1:
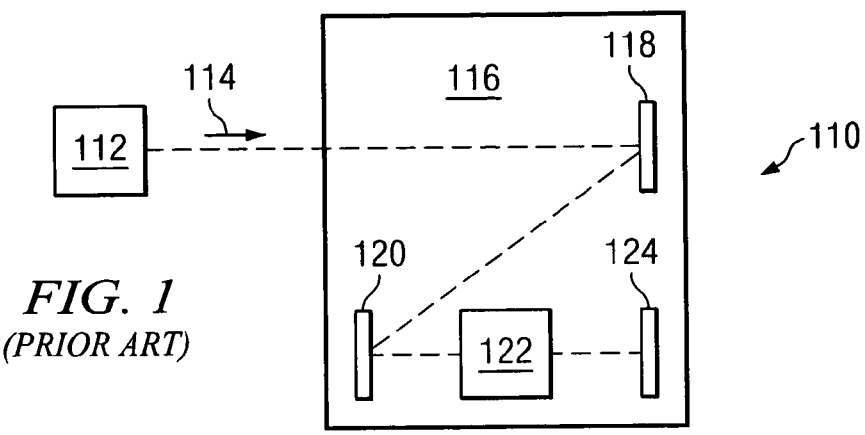
FIG. 1 is a block diagram of a prior art EUVL system, comprising an EUV light source and a EUV exposure tool comprising a plurality of multi-layer mirror elements.

A prior art EUVL system 110 is shown in FIG. 1. An EUV light source 112 is adapted to generate and direct EUV light or radiation 114 towards an EUV exposure tool 116. The EUVL system 110 may be used to transfer a pattern from a mask 118 of the EUV exposure tool 116 to a wafer 124. The EUV light 114 is transmitted along a predetermined light path using a plurality of multi-layer mirrors elements, represented by multi-layer mirror element 120 and mirror system 122. The mirror system 122 may comprise a plurality of multi-layer mirror elements such as the multi-layer mirror element 120. Other multi-layer mirror elements 120 may also be present along the light path of the EUV light 114 in the system, not shown. The multi-layer mirror element 120 and the mirror system 122 typically comprise Bragg reflectors that include alternating layers of a pair of materials, for example.

In an EUV exposure tool 116, the multi-layer mirror element 120 and the mirror system 122 comprise projection optics that project patterns from the mask 118 onto the wafer 124. The optics are reflective, and it is difficult to protect the optics from oxidation and carbon deposition that are induced by the EUV light 114 that is reflected off the optics. Water vapor from background water vapor pressure in the system 110 adsorbs on the surfaces of multi-layer mirror elements 120 and is dissociated (e.g., into O and OH) by the incoming EUV light 114 directly, or by secondary electrons generated by the incoming EUV light 114. The oxygen produced from dissociated water molecules diffuses and can oxidize the multi-layer mirror elements 120, causing them to lose reflectivity. The EUV light or radiation 114 directly or indirectly dissociates the water molecules on the multi-layer mirror element 120 surface, generating radicals such as oxygen or OH, which are both very damaging to the multi-layer mirror element 120, resulting in reduced reflectivity of the multi-layer mirror elements 120.

Figure 2:
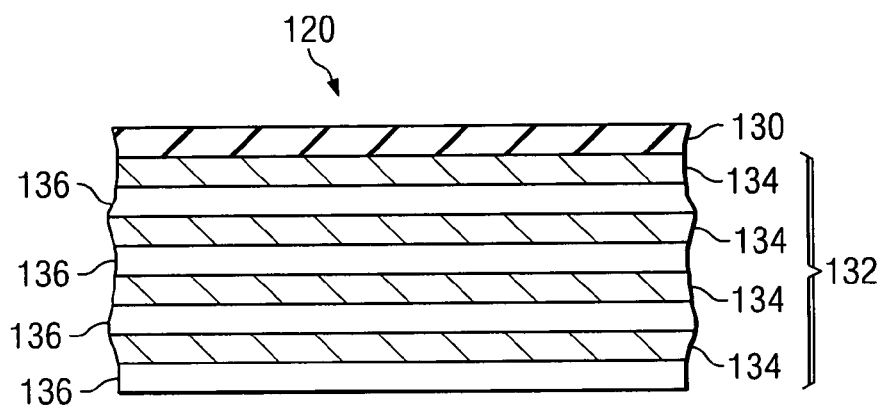
FIG. 2 is a cross-sectional view of a prior art multi-layer mirror element having a multi-layer material stack comprising alternating layers of two materials, and a capping layer formed thereon.

Capping layers are under development for use as a protective layer for multi-layer mirror elements in EUV exposure tools. Potential materials for use as capping layers include noble metals and alloys, ceramics, glasses, transition metals, and metal oxides, as examples. FIG. 2 shows a cross-sectional view of a prior art multi-layer mirror element 120 comprising a multi-layer material stack 132 with a capping layer 130 formed thereon. The multi-layer material stack 132 comprises a Bragg reflector, comprising a plurality of alternating first and second material layers 134 and 136, respectively. The first material layers 134 may comprise molybdenum (Mo), and the second material layers 136 may comprise silicon (Si), for example, although the first material layers 134 and the second material layers 136 may alternatively comprise other material combinations, e.g., molybdenum and beryllium (Be), or other high-Z and low-Z material combinations, with Z being the atomic number. For example, material combinations used in the art for Bragg reflectors in include ReW—C, (e.g., the first material layers 134 comprise ReW and the second material layers 136 comprise C), W—C, W—B$_4$C, W—Si, AuPd—C, Ru—C, Rh—C, Rh—B$_4$C, Fe—C, Co—C, Ni—C, Mo—Si, Mo—Be, and Ru—Be, as examples. Each pair of first material layer 134 and second material layer 136 forms a bi-layer, and the multi-layer material stack 132 may comprise a stack of about 40 to 50 bi-layers 134/136, for example. The multi-layer material stack 132 typically has an EUV reflectance of about 70% or less in EUVL applications, for example.

In order to function in a EUVL system 110 such as the one shown in FIG. 1 without deleteriously affecting the performance of the EUVL system 110, there are several features that are required for a protective capping layer 130 of a multi-layer mirror element 120. The capping layer 130 should not reduce the EUV reflectivity of the EUV multi-layer mirror element. The capping layer 130 must be very thin to avoid reducing the EUV reflectivity, e.g., it should comprise a thickness on the order of a few atomic layers. A reduction in as little as 1% of the reflectivity of the multi-layer mirror element 120 is unacceptable, for example. Thus, capping layers 130 in development typically comprise a thickness of about 1 to 2 nm.

Also, the capping layer 130 needs to be stable over an extended period of time with respect to oxidation. The capping layer 130 should be compact and dense, with no pinholes, in order to prevent diffusion of materials such as hydrogen below the capping layer 130 or to prevent oxidation of the layers beneath the capping layer 130 by atomic oxygen diffusion. For example, hydrogen can be generated by EUV light-induced dissociation of water molecules.

However, there are restrictive processing conditions for forming the capping layer 130. The deposition temperatures for the capping layer 130 cannot exceed the temperature limit above which the multi-layer material stack 132 is damaged, e.g., by multi-layer compaction and/or interface diffusion or superlattice intermixing. It is difficult to form a very thin, dense, pinhole free capping layer 130 at low deposition temperatures.

Prior art capping layers 130 have not been successful in preventing oxidation. Over time, the capping layers 130 form cracks and openings, so that contaminants can reach the surface of the multi-layer mirror element 120 and reduce reflectivity. A challenge in the EUV lithography industry is to discover suitable materials for capping layers 130 that will prevent oxidization of the underlying multi-layer mirror elements 120.

A heretofore unrecognized problem with forming capping layers over multi-layer mirror elements is that if a multi-layer material stack has internal stress and a capping layer is formed over the stressed multi-layer material stack, then as the multi-layer mirror element undergoes stress relaxation, which will occur over time at room temperature over a period of time, e.g., over a time period of about one to six months, the stress relaxation of the underlying multi-layer material stack will cause damage to the capping layer. Embodiments of the present invention achieve technical advantages by relaxing the stress of the multi-layer material stack prior to forming the capping layer over the multi-layer material stack.

Figure 3A:
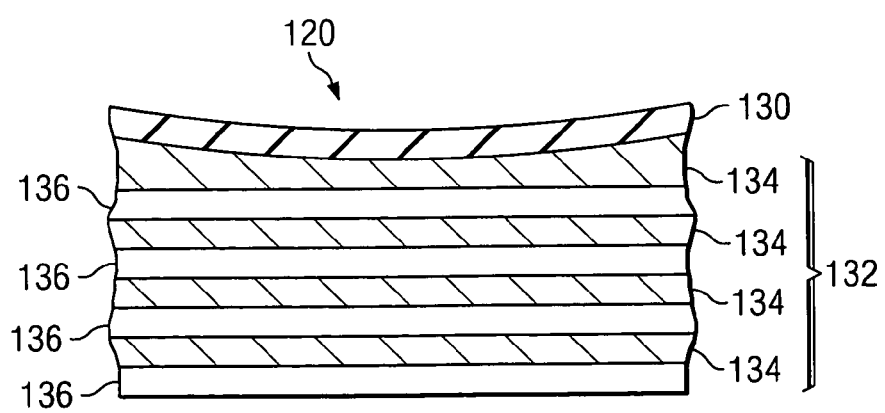
FIG. 3A shows a cross-sectional view of a prior art multi-layer mirror element in which the multi-layer material stack has internal tensile stress and a capping layer is formed thereon.
Figure 3B:
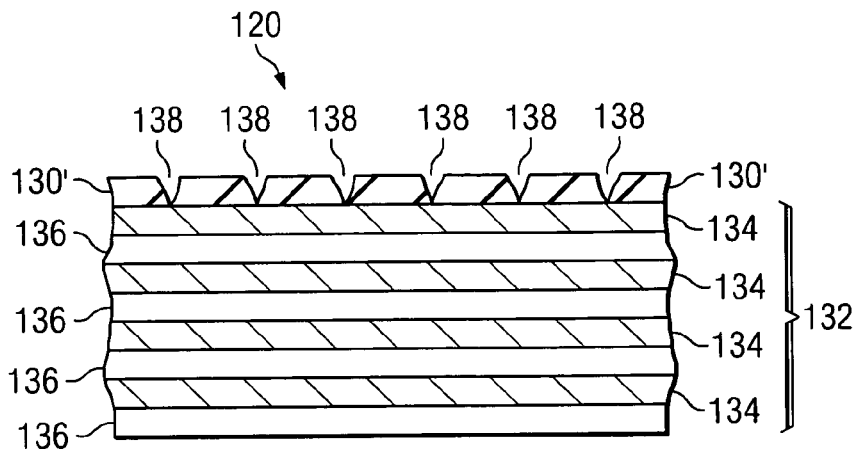
FIG. 3B shows the multi-layer mirror element of FIG. 3A after the internal stress of the multi-layer material stack has relaxed, causing cracks and fissures in the capping layer, providing paths for oxygen to reach the multi-layer material stack and cause oxidation of the multi-layer material stack, which reduces the reflectivity of the multi-layer mirror element.
Figure 4A:
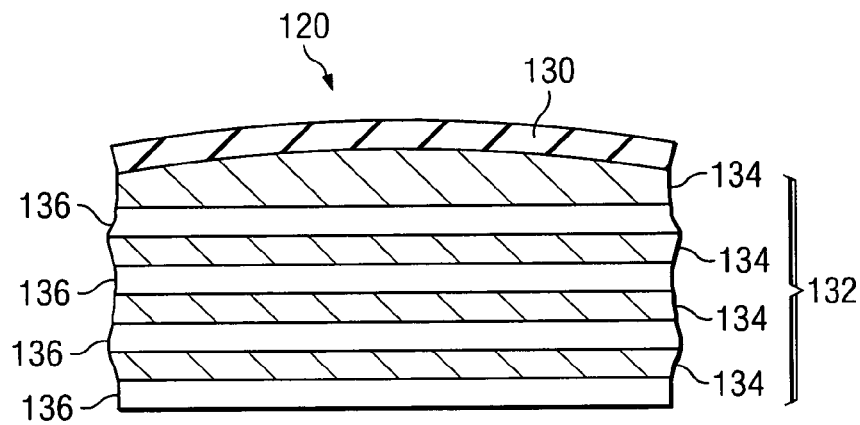
FIG. 4A shows a cross-sectional view of a prior art multi-layer mirror element in which the multi-layer material stack has internal compressive stress and a capping layer formed thereon.
Figure 4B:
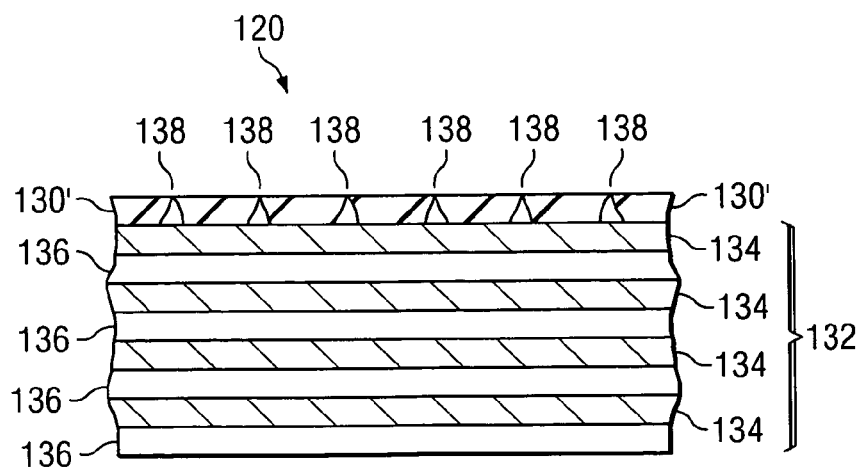
FIG. 4B shows the multi-layer mirror element of FIG. 4A after the internal stress of the multi-layer material stack has relaxed, causing cracks and fissures in the capping layer and causing oxidation.

FIGS. 3A, 3B, 4A, and 4B illustrate more clearly the damage internal stress relaxation causes. If a thin capping layer 130 is formed over a top surface of a multi-layer material stack 132 that has internal stress, cracks are formed in the thin capping layer 130, due to the significant change in stress in stress over a period of time. FIGS. 3A and 4A illustrate cross-sectional views of multi-layer mirror elements 120 having a capping layer 130 formed on a multi-layer material stack 132 that has internal tensile stress, and a capping layer 130 formed on a multi-layer material stack 132 that has internal compressive stress, respectively. Over time, as the internal stress of the multi-layer material stack 132 relaxes, the resulting capping layer 130' is damaged during the stress relaxation, as shown in FIGS. 3B and 4B, respectively, causing the development of micro-cracks, fissures, pinholes, and/or voids 138, and which also may result in reduced film adhesion of the capping layer 130' to the multi-layer material stack 132. The stress relaxation of the underlying multi-layer material stack 132 can lead to early capping layer 130' failure, by opening pathways to oxidation, or hydrogen migration that may impact properties of an optional additional diffusion barrier that may be disposed between the capping layer 130/130' and the multi-layer material stack 132 (a diffusion barrier is not shown in FIG. 3A, 3B, 4A, or 4B; see FIGS. 5 and 6 at 142).

As deposited multi-layers of multi-layer mirror elements are known to exhibit considerable stress that relaxes over time. Without a capping layer, the stress would not present a problem, because the stress induced by the multi-layer deposition mostly leads to spherical aberrations, which can be easily corrected for in the assembled camera optics of the EUV exposure tool 116 (see FIG. 1). If the stress changes over time, respective changes can be made to the optics alignment. However, without a capping layer, the reflectivity of the multi-layer mirror element will be reduced over time due to degradation by oxidation.

Prior art EUV multi-layer mirror elements 120 and capping layers 130 are deposited in one deposition run, e.g., in magnetron sputter tools. The capping layers 130 are deposited on top of the multi-layer material stack 132 immediately after the multi-layer stack 132 deposition, in order to avoid exposing the bare multi-layer material stack 132 to the atmosphere, which would oxidize the top surface of the multi-layer material stack 132, forming an oxide layer between the multi-layer material stack 132 and the capping layers 130.

However, a previously unrecognized problem in the art is that if a capping layer 130 is deposited on top of the multi-layer material stack 132 immediately after the multi-layer material stack 132 deposition as shown in FIGS. 3A and 4A, with time, as the multi-layer material stack 132 undergoes internal stress relaxation, the changing stress of the multi-layer material stack 132 not only changes optics aberrations, but also deleteriously impacts the capping layer film quality, as shown in FIGS. 3B and 4B. Specifically, the stress change of the multi-layer material stack 132 leads to stress induced migration of capping layer 130' material, pinhole formation, and/or micro-crack formation 138 within the film 130', all of which expose the multi-layer material stack 132 beneath the capping layer 130' to oxidation and/or opens up diffusion channels which may lead to subsurface damage below the capping layer 130', reducing EUV light reflectivity of the multi-layer mirror element 120. In addition to reducing the reliability of the protective capping layer 130', film adhesion of the capping layer 130' also is affected by the stress relaxation of the multi-layer material stack 132.

Embodiments of the present invention achieve technical advantages by providing methods of reducing the negative effects of stress on capping layer reliability and optics lifetime. A preferred embodiment of the present invention will next be described with reference to FIGS. 5 and 6, which show cross-sectional views of a multi-layer mirror element 150 at various stages of manufacturing.

Figure 5:
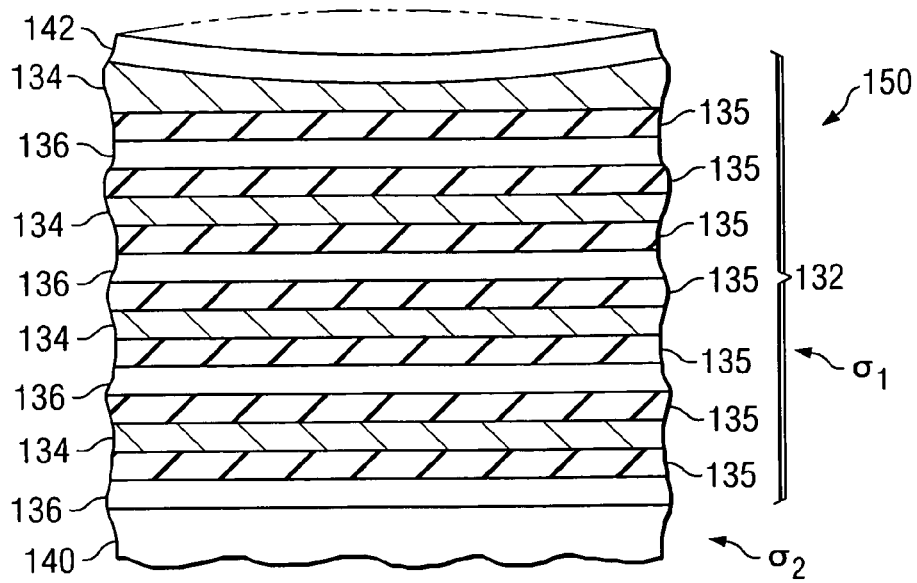
FIG. 5 shows a multi-layer material stack before tempering that has internal stress and also includes diffusion barriers between the materials of the multi-layer stack.

First referring to FIG. 5, a substrate 140 is provided. The substrate 140 preferably comprises a substrate material typically used in the manufacturing of Bragg reflectors, such as doped quartz glass, for example. The substrate 140 may comprise a binary material, such as titanium doped silicon, although alternatively, other substrate materials may also be used. The substrate 140 preferably comprises an ultra-low expansion material. The substrate 140 may comprise a thickness of about 6 mm or less for EUV mask substrates, and may comprise a significantly greater thickness for EUV optics substrates, such as 50 mm or greater, as examples. The substrate 140 is preferably placed into a first deposition chamber (not shown), in one embodiment.

A plurality of material layers 134 and 136, and optionally, 135, is formed over the substrate 140 to form a multi-layer material stack 132, as shown in FIG. 5. The multi-layer material stack 132 preferably comprises a pair of alternating materials 134 and 136, as described with reference to prior art FIG. 2, previously described herein, for example. The multi-layer material stack 132 preferably comprises a reflective material, for example. The multi-layer material stack 132 may comprise a thickness of about 300 to about 350 nm, and alternatively the multi-layer material stack 132 may comprise a thickness of about 500 nm or less, as examples.

In one embodiment, the multi-layer material stack 132 includes a diffusion barrier layer 135 between each of the material layers 134 and 136, as shown in FIG. 5. The diffusion barrier layer 135 preferably comprises a carbide material, such as boron carbide ($B_4C$), and may alternatively comprise C, B, Si, Be, Mg, or Al, as examples, although the diffusion barrier layer 135 may also comprise other materials. The diffusion barrier layers 135 are preferably very thin, e.g., about 1 nm or less, for example, although alternatively, the diffusion barrier layers 135 may comprise other dimensions. For example, if the first material 134 comprises Mo and the second material 136 comprises Si, an optional diffusion barrier layer 135 is preferably disposed between every first material 134 to second material 136 interface. The diffusion barrier layers 135 reduce the formation of silicide at the Mo—Si 134/136 interface. The diffusion barrier layers 135 stabilize the interfaces of Mo—Si 134/136 against diffusion, thereby generating sharper and more symmetric interfaces, resulting in a higher reflectivity and more heat resistant multi-layer material stack 132, for example.

Next, preferably without removing the substrate 140 from the first deposition chamber, an optional diffusion barrier 142 may be formed over the multi-layer material stack 132, as shown. The diffusion barrier 142 may comprise about 3 nm or less of a carbide material, such as boron carbide, for example, although alternatively, the diffusion barrier 142 may comprise other dimensions and materials, such as C, B, Si, Be, Mg, or Al, or other materials, as examples. In one embodiment, the diffusion barrier 142 preferably comprises a thickness of about 1 to 2 nm, for example.

After the deposition process, the multi-layer material stack 132 may comprise a first internal stress $\sigma_1$. Likewise, the substrate may comprise a second internal stress $\sigma_2$. Preferably, the diffusion barrier 142 comprises a material that does not have any significant internal stress, and thus does not increase the internal stress of the structure 150. The first internal stress $\sigma_1$ may comprise internal tensile stress, as shown in FIG. 5, or may alternatively comprise internal compressive stress, as shown in phantom in FIG. 5, as examples.

Next, to alleviate and relax the internal stresses $\sigma_1$ and $\sigma_2$, preferably, without removing the substrate 140 from the first deposition chamber, at least the multi-layer material stack 132 comprising the plurality of material layers 134/135/136 is heated, e.g., in an anneal process or tempering process. At least the multi-layer material stack 132 is preferably heated, to a temperature of about 300 degrees C. or less, in one embodiment, for a predetermined period of time. During the heating process, the substrate 140 and the diffusion barrier 160 may also be heated, for example, resulting in the relaxing of the internal stress of these materials 140 and 160, as well.

The multi-layer mirror element 150 is preferably heated for a sufficient period of time, and for a sufficient temperature, so that the first internal stress $\sigma_1$ and the second internal stress $\sigma_2$ are significantly reduced or relaxed. For example, a top portion of the multi-layer material stack 132 may comprise a high internal stress, and the heating step preferably reduces the internal stress of at least the top portion of the multi-layer material stack 132 in this embodiment by about 10% or greater. More preferably, the internal stress is reduced by at least 50%, and most preferably, the internal stress is reduced by at least 80%, as examples. The temperature of the heating step may be about 300 degrees C. or less, in a preferred embodiment, and in one embodiment, the temperature of the heating step comprises about 100 to 200 degrees C., for example. If diffusion barrier layers 135 are included in the multi-layer material stack 132, for example, advantageously, the multi-layer material stack 132 may be heated to a higher temperature, for example. The heating step is preferably performed in-situ in an inert gas atmosphere.

The multi-layer mirror element 150 may have an expected lifetime and a predicted stress level at the end of the expected lifetime. In this embodiment, the heating step preferably results in reducing the first internal stress $\sigma_1$ to at least the predicted stress level at the end of the expected lifetime of the multi-layer mirror element 150, for example.

Figure 6:
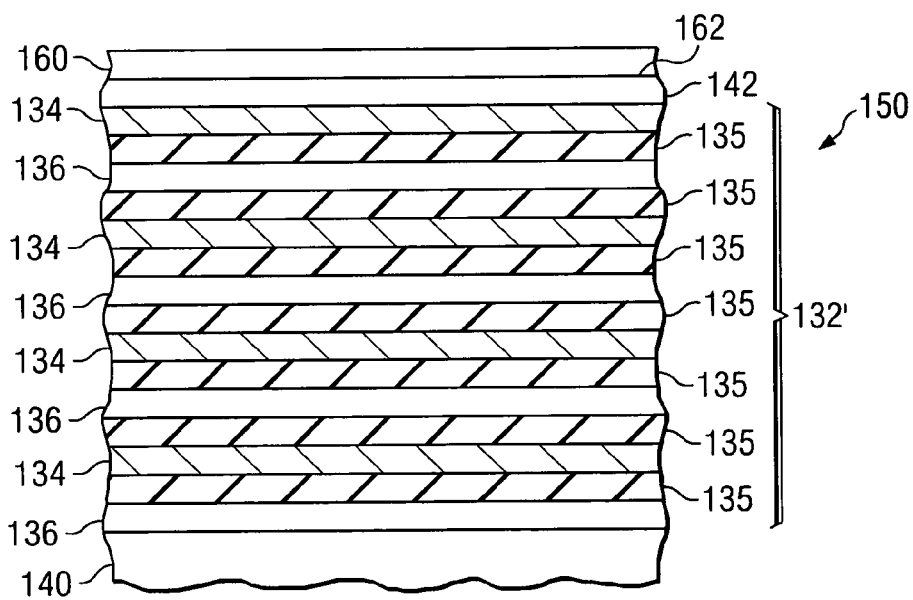
FIG. 6 shows the multi-layer material stack of FIG. 5 after tempering, after which a capping layer is formed over the top surface thereof in accordance with a preferred embodiment of the present invention.

Referring next to FIG. 6, after the heating step, a substantial amount of the internal stress has been reduced in the multi-layer material stack 132'. Next, preferably without removing the substrate 140 from the first deposition chamber, a capping layer 160 is then deposited or formed over the multi-layer material stack 132' or over the optional diffusion barrier 142, if present. The capping layer 160 preferably comprises about 3 nm or less of Ru, Ru oxide, Zr, Pd, PdAu, SiC, $MoSi_2$, or Yttrium Stabilized Zirconium (YSZ), as examples, although the capping layer 160 may alternatively comprise other dimensions and materials. The capping layer 160 preferably comprises a thickness of about 1 to 2 nm in one embodiment, for example. The capping layer 160 is preferably formed using magnetron deposition, chemical vapor deposition (CVD), ion beam sputter deposition, molecular beam epitaxy, atomic layer epitaxy or deposition, or electron beam evaporation, as examples, although other deposition processes may also be used.

Preferably, an inert gas is introduced into the first deposition chamber during the processing steps described above, to prevent oxidation of the multi-layer material stack 132'. For example, Ar or N may be introduced into the first deposition chamber, at least when heating the multi-layer mirror element 150, and also during the other processing steps described herein.

Preferably, in one embodiment, the multi-layer mirror element 150 is kept in the same, e.g., a first deposition chamber, after forming the multi-layer material stack 132, to deposit the optional barrier layer 142, to heat the device to reduce the internal stress, and to deposit the capping layer 160. Keeping the multi-layer material stack 132 in the same first deposition chamber during these manufacturing steps advantageously avoids the formation of an oxide over the multi-layer material stack 132'. In this embodiment, it may be necessary to modify the deposition chamber to add heatable wafer mounts, temperature control hardware and software, and also to add gas inlets and controls for annealing in an inert gas environment, for example. These modifications are not difficult to make to existing magnetron sputtering or electron beam induced deposition processing tools, for example.

However, in another embodiment, the multi-layer mirror element 150 may be moved to a second deposition chamber, after forming the multi-layer material stack 132, for example. In this embodiment, preferably the multi-layer mirror element 150 is transported using a system, e.g., a handler, adapted to control the ambient atmosphere the multi-layer material stack 132 is exposed to, to prevent the growth of an oxide on the surface thereof, for example.

Figure 7:
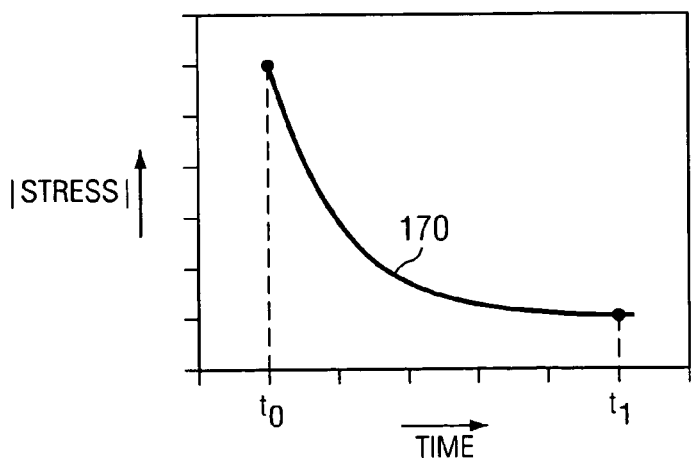
FIG. 7 is a graph showing the amount of internal stress over time of a material.

Thus, in accordance with embodiments of the present invention, preferably the capping layer 160 is deposited over the multi-layer material stack 132' after the film stress of the EUV reflecting multi-layer material stack 132' has relaxed. FIG. 7 is a graph 170 showing the amount of internal stress over time of a material. In accordance with an embodiment of the present invention, the capping layer 160 is deposited at a time $t_1$ when the stress of the multi-layer material stack 132' has essentially relaxed to a level where it will not change any more significantly over the lifetime of the multi-layer mirror element 150. Thus, stress-induced reliability problems of the capping layer 160, induced by the stress relaxation of the multi-layer material stack 132' over time, are reduced significantly in accordance with this embodiment of the present invention.

The optional diffusion barrier 142 disposed on top of the multi-layer material stack 132' provides an additional barrier to contaminants. The optional diffusion barrier layers 135 between the plurality of material layers 134 and 136 allows the annealing temperatures to be significantly higher, without deleteriously impacting the reflectivity of the multi-layer mirror element 150. For example, if diffusion barriers 135 are used through out the multi-layer material stack 132', e.g., at all 134/136 and 136/134 interfaces, the multi-layer material stack 132' may be heated to a temperature of about 200 to 300 degrees C. to accelerate the internal stress relaxation. Heating the multi-layer material stack 132' at a higher temperature is advantageous because the time needed for stress relaxation is reduced, for example.

Preferably, in one embodiment, the anneal process is performed at a high enough temperature and for a period of time, such that substantially all stress relaxation that is expected over the lifetime of a typical EUV multi-layer mirror element, e.g., about 30,000 hours or other time period, takes place in a much shorter time at elevated temperatures, wherein the temperature and time are compatible with keeping the EUV multi-layer stack 132 reflectivity at a predetermined level, for example.

Embodiments of the invention have useful application in other applications that require capping layers on reflective materials. For example, the methods described herein are useful in the manufacture of reflective lithography masks, such as EUV lithography masks. In this embodiment, a capping layer may be formed over a EUV lithography mask after the EUV lithography mask material is heated to reduce the internal stress, for example. Other EUV reflecting devices would also benefit from the novel methods of forming capping layers described herein, as well.

Advantages of embodiments of the present invention include preventing oxidation of multi-layer mirror elements 150 by reducing or eliminating the internal stress of the multi-layer material stacks 132, so that capping layers 160 are formed on a stress-free surface 132'. A more stable and reliable capping layer 160 is formed over the stress-free underlying surface 142 or 132', e.g., at 162 in FIG. 6. A continuous capping layer 160 may be formed as a result of annealing the multi-layer material stack 132 before forming the capping layer 160, depending on the deposition conditions and film thickness. Because the multi-layer material stack 132' is protected from oxidation, the multi-layer mirror elements 150 have a longer life, thus resulting in increased EUV optics lifetime and a cost savings. Furthermore, the reflectivity of the multi-layer mirror element 150 remains substantially the same, because the multi-layer mirror element 150 does not oxidize. Furthermore, carbon deposits can be cleaned from the top surface of the capping layer 160 without damaging the underlying multi-layer material stack 132'. In one embodiment, diffusion barrier layers 135 are included between the layers 134 and 136 of the multi-layer material stack 132, enabling heating of the multi-layer material stack 132 to a higher temperature, which reduces the amount of time required to reduce the internal stress. The novel method of forming capping layers 160 is a step towards enabling the viability of EUV lithography in high volume production environments, by increasing the lifetime of components of EUV lithography equipment.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of forming a capping layer over a multi-layer mirror element, the method comprising:
   providing the multi-layer mirror element, at least a top portion of the multi-layer mirror element having internal stress;
   heating at least the multi-layer mirror element, thereby reducing the internal stress of at least the top portion of the multi-layer mirror element; and
   forming the capping layer over the multi-layer mirror element.

2. The method according to claim 1, wherein providing the multi-layer mirror element comprises providing a multi-layer mirror element that has been formed in a first deposition chamber, wherein without removing the multi-layer mirror element from the first deposition chamber, the multi-layer mirror element is heated and the capping layer is formed over the multi-layer mirror element.

3. The method according to claim 1, wherein heating at least the multi-layer mirror element reduces the internal stress of at least the top potion of the multi-layer mirror element by about 10% or greater.

4. The method according to claim 1, wherein forming the capping layer comprises forming a capping layer comprising a noble metal or alloy, a ceramic material, a transition metal, or a metal oxide.

5. The method according to claim 1, wherein the multi-layer mirror element comprises a reflective lithography mask.

6. The method according to claim 1, wherein heating at least the multi-layer mirror element comprises heating at least the multi-layer mirror element to a temperature of about 300 degrees C. or less.

7. The method according to claim 1, wherein the multi-layer mirror element comprises a substrate and a plurality of material layers disposed over the substrate, wherein the substrate and plurality of material layers have internal stress, and wherein heating at least the multi-layer mirror element comprises decreasing the internal stress of the substrate and the plurality of material layers.

8. A method of manufacturing a multi-layer mirror element, the method comprising:
   providing a substrate;
   forming a plurality of material layers over the substrate, the plurality of material layers comprising a first internal stress;
   heating at least the plurality of material layers to reduce the first internal stress; and
   forming a capping layer over the plurality of material layers.

9. The method according to claim 8, further comprising forming a diffusion barrier over the plurality of material layers.

10. The method according to claim 8, wherein forming the diffusion barrier comprises forming about 10 nm or less of boron carbide ($B_4C$), C, B, Si, Be, Mg, or Al.

11. The method according to claim 8, wherein forming the plurality of material layers is performed in a first deposition chamber, and wherein heating at least the plurality of material layers and forming the capping layer are performed in the first deposition chamber after forming the plurality of material layers without removing the substrate from the first deposition chamber.

12. The method according to claim 8, wherein forming the plurality of material layers is performed in a first deposition chamber, further comprising moving the substrate to a second deposition chamber while protecting the plurality of material layers from oxidation, and wherein forming the capping layer is performed in the second deposition chamber.

13. The method according to claim 8, wherein heating at least the plurality of material layers reduces the first internal stress of plurality of material layers by about 10% or greater.

14. The method according to claim 8, wherein forming the capping layer comprises forming a capping layer comprising a noble metal or alloy, a ceramic material, a transition metal, or a metal oxide.

15. The. method according to claim 14, wherein forming the capping layer comprises forming about 3 nm or less of Ru, Ru oxide, Zr, Pd, PdAu, SiC, $MoSi_2$, or Yttrium Stabilized Zirconium (YSZ).

16. The method according to claim 8, wherein heating at least the plurality of material layers comprises heating at least the plurality of material layers a temperature of about 300 degrees C. or less.

17. The method according to claim 8, wherein heating at least the plurality of material layers comprises heating at least the plurality of material layers for a time period of about 30 minutes or greater.

18. The method according to claim 8, wherein the multi-layer mirror element has an expected lifetime and a predicted stress level at the end of the expected lifetime, wherein heating at least the plurality of material layers comprises reducing the first internal stress to at least the predicted stress level at the end of the expected lifetime of the multi-layer mirror element.

19. The method according to claim 8, wherein providing the substrate comprises providing a substrate having a second internal stress, wherein heating at least the plurality of material layers further comprises heating the substrate, and wherein heating the substrate comprises reducing the second internal stress.

20. The method according to claim 8, wherein at least heating at least the plurality of material layers comprises exposing the plurality of material layers to an inert gas.

21. The method according to claim 20, wherein exposing the plurality of material layers to the inert gas comprises exposing the plurality of material layers to Ar or N.

22. The method according to claim 8, wherein forming the plurality of material layers comprises forming a diffusion barrier layer between each of the plurality of material layers.

23. A method of manufacturing a multi-layer mirror element of an extreme ultraviolet lithography (EUVL) system, the method comprising:
   providing a substrate;
   placing the substrate in a deposition chamber;
   forming a plurality of material layers over the substrate, the plurality of material layers comprising a first internal stress;
   heating at least the plurality of material layers, reducing the first internal stress; and
   forming a capping layer over the plurality of material layers, wherein forming the plurality of material layers, heating at least the plurality of material layers, and forming the capping layer are performed in the deposition chamber without removing the substrate from the deposition chamber.

24. The method according to claim 23, further comprising forming a diffusion barrier over the plurality of material layers, before or after heating at least the plurality of material layers.

25. The method according to claim 23, wherein providing the substrate comprises providing a substrate with a second internal stress, wherein heating at least the plurality of material layers further comprises heating the substrate, wherein heating the substrate reduces the second internal stress.

* * * * *